US008170236B2

(12) United States Patent
Kondo et al.

(10) Patent No.: US 8,170,236 B2
(45) Date of Patent: May 1, 2012

(54) PITCH DETECTION APPARATUS AND METHOD

(75) Inventors: Takayasu Kondo, Hamamatsu (JP); Kiyoto Kuroiwa, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 357 days.

(21) Appl. No.: 12/616,702

(22) Filed: Nov. 11, 2009

(65) Prior Publication Data

US 2010/0119082 A1 May 13, 2010

(30) Foreign Application Priority Data

Nov. 12, 2008 (JP) ................................ 2008-289974

(51) Int. Cl.
*H03G 5/00* (2006.01)

(52) U.S. Cl. ......................................... 381/98; 381/103

(58) Field of Classification Search .......... 381/103-107, 381/98
See application file for complete search history.

(56) References Cited

U.S. PATENT DOCUMENTS

| | | | |
|---|---|---|---|
| 2,859,405 A | 11/1958 | Feldman et al. | |
| 7,288,709 B2 | 10/2007 | Chiba | |
| 2005/0195990 A1 * | 9/2005 | Kondo et al. | 381/92 |

FOREIGN PATENT DOCUMENTS

| | | |
|---|---|---|
| EP | 1 906 385 A1 | 4/2008 |
| JP | 61-026089 | 2/1986 |
| WO | WO-01/29822 A1 | 4/2001 |

OTHER PUBLICATIONS

Chazan, D. et al. (Sep. 2001). "Efficient Periodicity Extraction Based on Sine-Wave Representation and its Application to Pitch Determination of Speech Signals," Eurospeech 4(3), four pages.
European Search Report mailed Apr. 9, 2010, for EP Application No. 09175464.8, 10 pages.
Partial European Search Report mailed Jan. 22, 2010, for EP Application No. 09175464.8, four pages.

* cited by examiner

*Primary Examiner* — Devona Faulk
*Assistant Examiner* — George Monikang
(74) *Attorney, Agent, or Firm* — Morrison & Foerster LLP

(57) ABSTRACT

Band-pass filter suppresses frequency components of a sound signal that are lower than a low-side cutoff frequency and that are higher than a high-side cutoff frequency. Pitch detection section detects a pitch of the sound signal having been processed by the band-pass filter. Target setting section variably sets a low-side target value lower than the pitch detected by the pitch detection section and a high-side target value higher than the detected pitch. Filter control section causes the low-side cutoff frequency to approach the low-side target value over time and causes the high-side cutoff frequency to approach the high-side target value over time. In this way, a pass band of the band-pass filter can be smoothly variably controlled in accordance with pitch change of the sound signal that is an object of pitch detection.

16 Claims, 4 Drawing Sheets

PITCH DETECTION APPARATUS AND METHOD

BACKGROUND

The present invention relates to a technique for detecting a pitch (or fundamental frequency) of an audio or sound signal.

Heretofore, there have been proposed various techniques for detecting a pitch of an audio or sound signal. Japanese Patent Application Laid-open Publication No. SHO-61-26089 discloses an example technique, where detection is made of a pitch of a sound signal having passed through a low-pass filter and where the cutoff frequency of the low-pass filter is variably controlled in accordance with a result of the pitch detection. The pitch detection technique disclosed in the No. SHO-61-26089 publication can advantageously detect a pitch of a sound signal with a high accuracy because, of the sound signal, intensities of peaks other than a peak corresponding to the pitch are controlled.

However, with the technique disclosed in the No. SHO-61-26089 publication, where the cutoff frequency of the low-pass filter is changed instantaneously to a frequency corresponding to the detected pitch of the sound signal at a predetermined time point after the pitch detection, pitches detected before and after the change of the cutoff frequency tend to become unstable.

SUMMARY OF THE INVENTION

In view of the foregoing, it is an object of the present invention to detect a pitch of a sound signal with a high accuracy and in a stable manner.

In order to accomplish the above-mentioned object, the present invention provides an improved pitch detection apparatus, which comprise: a band-pass filter which suppresses frequency components of a sound signal that are lower than a low-side cutoff frequency and that are higher than a high-side cutoff frequency; a pitch detection section which detects a pitch of the sound signal having been processed by the band-pass filter; a target setting section which, in accordance with the pitch detected by the pitch detection, variably sets a low-side target value lower than the detected pitch and a high-side target value higher than the detected pitch; and a filter control section which not only causes the low-side cutoff frequency to approach the low-side target value over time (i.e., with the passage of time) but also causes the high-side cutoff frequency to approach the high-side target value over time.

According to the present invention, the low-side target value and the high-side target value are variably set in accordance with a detected pitch of a sound signal. Once the low-side target value and the high-side target value are changed, the low-side cutoff frequency and the high-side cutoff frequency are caused to approach the changed low-side target value and the changed high-side target value, respectively, progressively over time without the low-side and high-side cutoff frequencies, which determines the pass band of the band-pass filter, being switched instantaneously to the changed low-side and high-side target values. In this way, the pass band of the band-pass filter can be smoothly (i.e., not rapidly) variably controlled in response to pitch change of the sound signal that is an object of pitch detection.

According to another aspect of the present invention, there is provided an improved pitch detection apparatus, which comprises: a holding section which time-serially holds a sound signal; a band-pass filter which suppresses frequency components of the sound signal that are outside a pass band; a pitch detection section which detects a pitch of the sound signal, having been processed by the band-pass filter, for each of predetermined time frames; a control section which variably sets the pass band of the band-pass filter in accordance with the pitch detected by the pitch detection section; and an output control section which normally supplies sound signals of the individual time frame to the band-pass filter with a first cyclic period. Once a state of the pitch detection by the pitch detection section changes, in a given one of the time frames, from a state where no pitch could be detected to another state where a pitch could be detected, the output control section supplies, in time-serial order, sound signals of the given time frame and a plurality of previous time frames, preceding the given time frame, from the holding section to the band-pass filter with a second cyclic period shorter than the first cyclic period, so that a pitch detection operation is performed again on the sound signals of the plurality of time frames by the pitch detection section.

According to the other aspect, once the state of the pitch detection by the pitch detection section changes, in a given time frame, from the state where no pitch could be detected (i.e., non-pitch-detectable state) to the other state where a pitch could be detected (i.e., pitch-detectable state), the pitch detection operation (i.e., band-pass filtering operation) is performed again on the sound signals of the plurality of previous time frames, for which no pitch could be detected, using a pass band optimally set in correspondence with the given time frame for which a pitch could be detected. Thus, the present invention can accurately and stably detect a pitch of the sound signal in an in-between (or state change) period when the non-pitch-detectable state changes to the pitch-detectable state.

The present invention may be constructed and implemented not only as the apparatus invention as discussed above but also as a method invention. Also, the present invention may be arranged and implemented as a software program for execution by a processor such as a computer or DSP, as well as a storage medium storing such a software program. In this case, the program may be provided to a user in the storage medium and then installed into a computer of the user, or delivered from a server apparatus to a computer of a client via a communication network and then installed into the client's computer. Further, the processor used in the present invention may comprise a dedicated processor with dedicated logic built in hardware, not to mention a computer or other general-purpose type processor capable of running a desired software program.

The following will describe embodiments of the present invention, but it should be appreciated that the present invention is not limited to the described embodiments and various modifications of the invention are possible without departing from the basic principles. The scope of the present invention is therefore to be determined solely by the appended claims.

BRIEF DESCRIPTION OF THE DRAWINGS

For better understanding of the object and other features of the present invention, its preferred embodiments will be described hereinbelow in greater detail with reference to the accompanying drawings, in which.

DETAILED DESCRIPTION

A. First Embodiment

Figure 1:
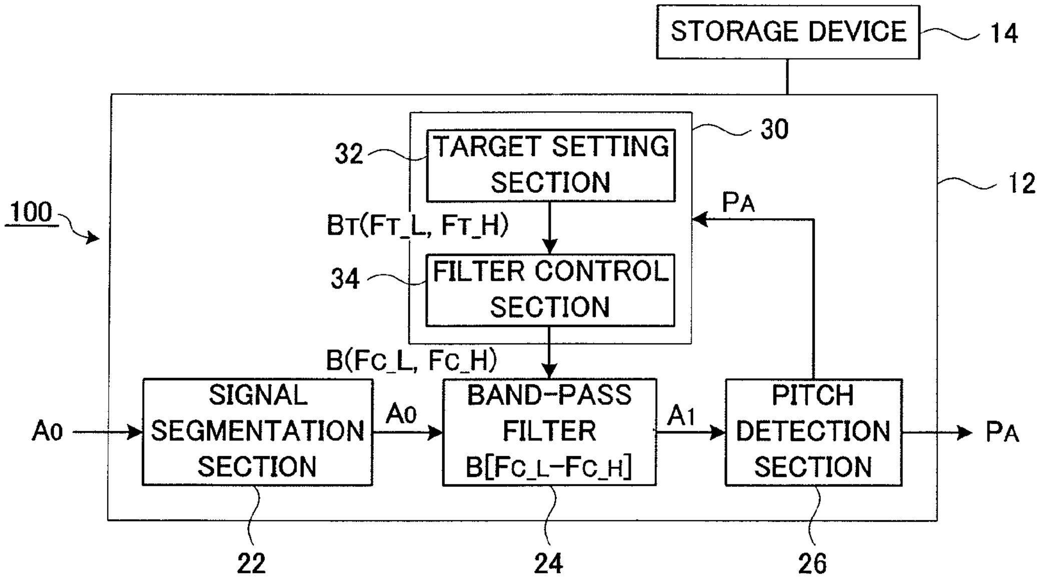
FIG. 1 is a block diagram showing a pitch detection apparatus according to a first embodiment of the present invention.

FIG. 1 is a block diagram showing a pitch detection apparatus 100 according to a first embodiment of the present invention. Each sound signal A0, of which pitch is to be detected i.e. which is an object of pitch detection, is supplied (or input) to the pitch detection apparatus 100. The sound signal A0 is a time series of signal values (e.g., a train of intensity samples) indicative of a waveform, on a time axis, of a sound (voice or musical tone). Supply source (not shown) of sound signals A0 is, for example, a sound pickup device that generates sound signals A0 corresponding to ambient sounds, and/or a reproduction device that acquires and outputs sound signals A0 from a recording medium. The pitch detection apparatus 100 detects a pitch (fundamental frequency) PA of each supplied sound signal A0.

As shown in FIG. 1, the pitch detection apparatus 100 is implemented by a computer system that includes an arithmetic processing device 12 and a storage device 14. The storage device 14 stores therein programs and various data to be used for detecting a pitch PA from a sound signal A0. Any suitable conventionally-known storage medium, such as a semiconductor storage or magnetic storage medium, may be employed as the storage device 14.

The arithmetic processing device 12 functions as a plurality of components, such as a signal segmentation section 22, band-pass filter 24, pitch detection section 26 and control section 30, by executing the programs stored in the storage device 14. There may be employed an alternative construction where an electronic circuit (DSP) dedicated to processing of a sound signal A0 implements the individual components of the arithmetic processing device 12, or where the individual components of the arithmetic processing device 12 are provided distributively on a plurality of integrated circuits.

The signal segmentation section 22 of FIG. 1 segments a supplied sound signal A0 into a plurality of time frames (hereinafter referred to as "unit segments") U on the time axis. Each of the unit segments U is a segment to be used as a minimum unit for pitch detection; namely, a pitch PA is detected for each of the unit segments U. For example, each of the unit segments U corresponds to a predetermined number of signal sample values (e.g., 128 signal sample values) of the sound signal A0.

The band-pass filter 24 generates a sound signal A1 by attenuating frequency components, outside its pass band B, of the sound signal A0 having been subjected to the processing by the signal segmentation section 22. The pass band B is a frequency band between a low-side cutoff frequency FC_L and a high-side cutoff frequency FC_H. Namely, the band-pass filter 24 suppresses frequency components of the sound signal A0 which are lower than the low-side cutoff frequency FC_L and higher than the high-side cutoff frequency FC_H.

The low-side cutoff frequency FC_L and the high-side cutoff frequency FC_H are variably set under control of the control section 30, as will be later described in detail. The band-pass filter 24 may comprise a high-pass filter having the low-side cutoff frequency FC_L as its cutoff frequency, and a low-pass filter having the high-side cutoff frequency FC_H as its cutoff frequency. Note that there may be employed an alternative construction where the signal segmentation section 22 segments the sound signal A1, having been processed by the signal segmentation section 22, into unit segments U.

The pitch detection section 26 detects a pitch PA of the sound signal, having been processed by the band-pass filter 24, for each of the unit segments U. For each of the unit segments U of the sound signal A1 for which no pitch PA has been detected (like a unit segment U of an unvoiced sound or a no-sound-generated unit U which has no clear harmonic structure), a result indicating "no pitch has been detected" (or non-pitch-detectable state) is output.

The pitch PA can be calculated as a logarithmic value in cents, as defined in Mathematical Expression (1) below. Coefficient F0 in Mathematical Expression (1) represents a minimum value of possible frequencies (Hz) which the sound signal A1 is assumed to have, and this coefficient F0 is set at an appropriate value in accordance with a characteristic of a sound generation source (such as a musical instrument or a human). In the case of a sound signal A0 obtained by sampling a performance tone of a guitar, for example, the coefficient F0 is set at 8.1757989 Hz. Further, a coefficient FP in Mathematical Expression (1) represents a pitch (fundamental frequency) in hertz (Hz) of the sound signal A1.

$$PA=1200.0*\log 2(FP/F0)\ [\text{cent}] \tag{1}$$

Any suitable conventionally-known technique may be employed for detecting a pitch PA of a sound signal A1. For example, there may be employed a method where extreme values in a trajectory of the greater of reference values attenuating over time from intensities of individual peaks of a sound signal A1 and signal values of the sound signal A1 are detected as peaks of the sound signal A1 and then a pitch PA is detected from intervals between the peaks (e.g., the method disclosed in Japanese Patent Application Laid-open Publication No. SHO-61-44330). Also suitable for detecting a pitch PA of a sound signal A1 is a zero crossing method where a pitch PA is detected on the basis of intervals between zero crossover points at which the intensity of the sound signal A1 changes across zero, or an auto correlation method where a pitch PA is detected on the basis of a section where autocorrelation values of a sound signal A1 become greatest (i.e., pitch period of the sound signal A1).

The control section 34 variably controls the pass band B (determined by the low-side cutoff frequency FC_L and high-side cutoff frequency FC_H) of the band-pass filter 24, and it includes a target setting section 32 and a filter control section 34. The target setting section 32 variably sets a target value of the low-side cutoff frequency FC_L (hereinafter referred to as "low-side target value") and a target value of the high-side cutoff frequency FC_H (hereinafter referred to as "high-side target value") in accordance with the pitch PA detected by the pitch detection section 26.

Figure 2:
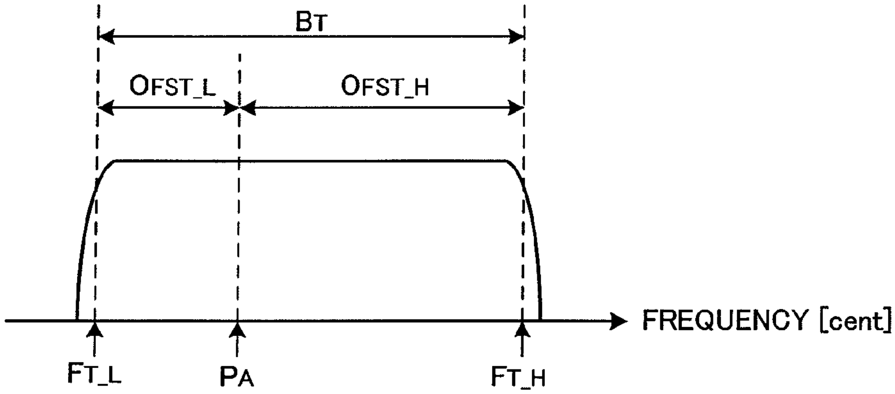
FIG. 2 is a conceptual diagram explanatory of relationship between a target band and a pitch in the first embodiment.

As shown in FIG. 2, the low-side target value FT_L is a frequency lower than the pitch PA, while the high-side target value FT_H is a frequency higher than the pitch PA. More specifically, the target setting section 32 sets, as the low-side target value FT_L, a frequency calculated by subtracting a first predetermined offset value OFST_L (in cents) from the pitch PA (see Mathematical Expression (2a) below) and sets, as the high-side target value FT_H, a frequency calculated by adding a second predetermined offset value OFST_H (in cents) to the pitch PA (see Mathematical Expression (2b) below). Frequency band between the low-side target value FT_L and the high-side target value FT_H (hereinafter referred to as "target band") BT is used as a target of change of the pass band B of the band-pass filter 24. As shown in FIG. 2, the pitch PA is a frequency within (i.e., inside) the target band BT. Note that the target band BT has a bandwidth of a fixed value (OFST_L+OFST_H) (cent value) that does not depend on the pitch PA.

$$FT\_L=PA-OFST\_L \quad (2a)$$

$$FT\_H=PA+OFST\_H \quad (2b)$$

The predetermined offset values OFST_L and OFST_H are selected, for example, in accordance with a characteristic of a sound generation source of a sound signal A0 (such as a type or tone color of a musical instrument). Tone of a guitar, for example, has the characteristic that components of overtones (particularly the second overtone) of the tone are greater in intensity than a component of a pitch (fundamental frequency) PA. Thus, the predetermined offset value OFST_H is set at a greater value (cent value) than the predetermined offset value OFST_L so that the target band BT includes frequencies of the second and third overtones corresponding to the assumed pitch PA of the sound signal A1. Consequently, as shown in FIG. 2, the target band BT is a frequency band having a high-side range wider than a low-side range as viewed from the pitch PA.

The filter control section 34 of FIG. 1 sequentially updates the low-side cutoff frequency FC_L and high-side cutoff frequency FC_H of the pass band B per each of the unit segments U in such a manner that the pass band B of the band-pass filter 24 approaches the target band BT per each of the unit segments U.

Figure 3:
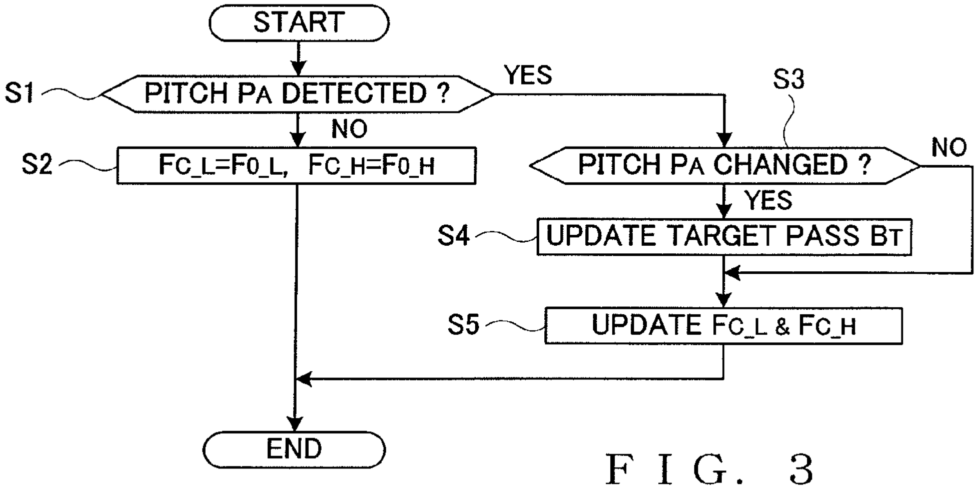
FIG. 3 is a flow chart of behavior of a control section in the first embodiment.
Figure 4:
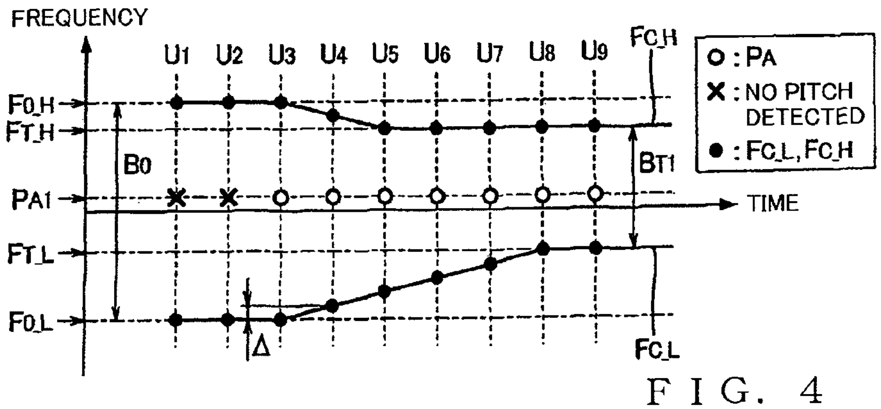
FIG. 4 is a timing chart explanatory of relationship between pass bands and pitches in the first embodiment.

FIG. 3 is a flow chart explanatory of behavior of the control section 30 (target setting section 32 and filter control section 34). Process of FIG. 3 is executed each time the pitch detection section 26 detects a pitch PA (per unit segment U). FIG. 4 illustrates changes over time, or with the passage of time, of the pass band B (low-side cutoff frequency FC_L and high-side cutoff frequency FC_H) and the pitch PA. In the illustrated example of FIG. 4, it is assumed that no pitch PA is detected in the unit segments U1 and U2 (as indicated by mark "X").

Upon start of the process of FIG. 3, the control section 30 determines, at step S1, whether the pitch detection section 26 has detected (or could detect) a pitch PA. If no pitch PA has been detected (i.e., no clear harmonic structure is present in the unit segment U in question) as determined at step S1, the filter control section 34 initializes the low-side cutoff frequency FC_L of the pass band B to a predetermined value (hereinafter referred to as "low-side initial value") F0_L and initializes the high-side cutoff frequency FC_H of the pass band B to a predetermined value (hereinafter referred to as "high-side initial value") F0_H, as shown in FIG. 4, at step S2. Namely, the pass band B of the band-pass filter 24 is initialized to an initial band B0 between the low-side initial value F0_L and the high-side initial value F0_H. The low-side initial value F0_L and the high-side initial value F0_H are set in accordance with a characteristic of a sound generation source of a sound signal A0 (such as a type or tone color of a musical instrument) in such a manner that all possible pitches PA that may be detected for the sound signal A0 fall within the initial band B0. The initial band B0 has a bandwidth greater than the bandwidth (OFST_L+OFST_H) of the target band BT.

If the pitch detection section 26 has detected (or could detect) a pitch PA (YES determination at step S1), the control section 30 further determines, at step S3, whether the detected pitch PA is different, i.e., has changed, from a pitch PA in the immediately preceding unit segment U. More specifically, the control section 30 determines that the detected pitch PA in the current unit segment U has changed from the pitch PA in the immediately preceding unit segment U, if the absolute value of a difference between the pitch PA in the current unit segment U and the pitch PA in the immediately preceding unit segment U is greater than a predetermined value; otherwise, the control section 30 determines that the detected pitch PA in the current unit segment U has not changed from the pitch PA in the immediately preceding unit segment U. Affirmative (i.e., YES) determination is also made at step S3 when no pitch PA was detected in the immediately preceding unit segment U.

With a YES determination at step S3, the target setting section 32 updates the target band BT (i.e, low-side target value FT_L and low-side target value FT_H) in accordance with the detected pitch PA, at step S4. Namely, the target setting section 32 sets a low-side target value FT_L and high-side target value FT_H by performing the arithmetic operations of Mathematical Expressions (2a) and (2b) on the detected pitch PA in the current unit segment U. Namely, the low-side target value FT_L and high-side target value FT_H are updated each time the sound signal A0 changes in pitch PA.

Following step S4, the filter control section 34 at step S5 updates the low-side cutoff frequency FC_L and high-side cutoff frequency FC_H so that the pass band BT of the band-pass filter 24 approaches the target band BT updated at step S4. If, on the other hand, the pitch PA detected by the pitch detection section 26 in the current unit segment U has not changed from the pitch PA in the immediately preceding unit segment U (NO determination at step S3), the filter control section 34 goes to step S5, without performing updating of the target pass band BT (step S4), to update (or interpolate between) the low-side cutoff frequency FC_L and high-side cutoff frequency FC_H. The operation at step S5 will be detailed below.

Let's assume a case where a pitch PA1 is detected in the unit segment U3 (YES determination at step S3) as shown in FIG. 4 and the pitch PA1 does not change in the individual unit segments U (U4, U5, . . . ) following the unit segment U3. The target setting section 32 sets a target band BT1 corresponding to the pitch PA1. Per each of the unit segments U, the filter control section 34 increases or decreases the low-side cutoff frequency FC_L by a predetermined value (i.e., unit change amount) Δ in such a way to approach the low-side target value FT_L of the target band BT1 corresponding to the pitch PA1. Once the low-side cutoff frequency FC_L reaches a predetermined range including the low-side target value FT_L, i.e. when the low-side cutoff frequency FC_L has sufficiently approached the low-side target value FT_L, the filter control section 34 terminates the changing of the low-side cutoff frequency FC_L. Likewise, the filter control section 34 increases or decreases the high-side cutoff frequency FC_H by a predetermined value Δ until it sufficiently approaches the high-side target value FT_H. Through repetition of the aforementioned operation, the pass band B of the band-pass filter 24 approaches the target band BT1 progressively over time (i.e., with the passage of time), so that the pass band B reaches the target band BT1 at the time of the unit segment U8.

Figure 5:
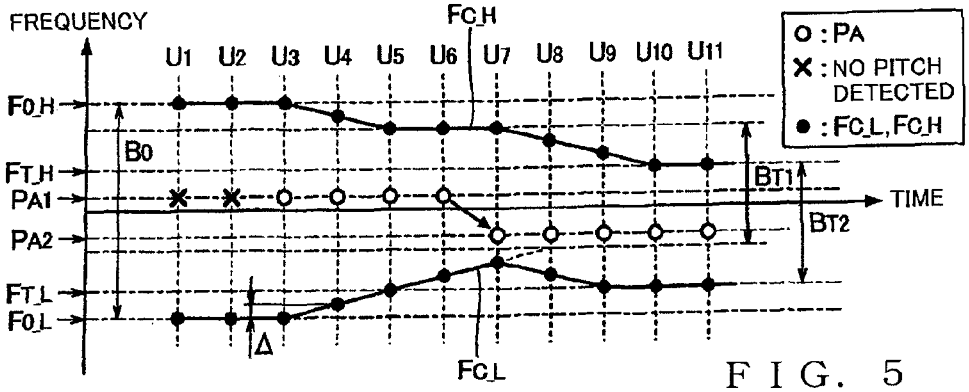
FIG. 5 is a timing chart explanatory of relationship between pass bands and pitches in the first embodiment.

FIG. 5 shows change over time (i.e., with the passage of time) of the pass band B when the pitch PA has changed while the pass band B is changing to the target band BT1 corresponding to a pitch PA1. More specifically, it is assumed here that a pitch PA2 different from the pitch PA1 of the unit segment U6 has been detected in the unit segment U7 (YES determination at step S3). The target setting section 32 updates the target band BT1, corresponding to the unchanged PA1 (i.e., pitch that was being detected before the pitch change), to a target band BT2 corresponding to the changed PA2, at step S4. Thus, in and after the unit segment U8, the pass band B of the band-pass filter 24 continues to narrow over time from the one of the unit segment U7 toward the updated target band BT2, at step S5.

Figure 6:
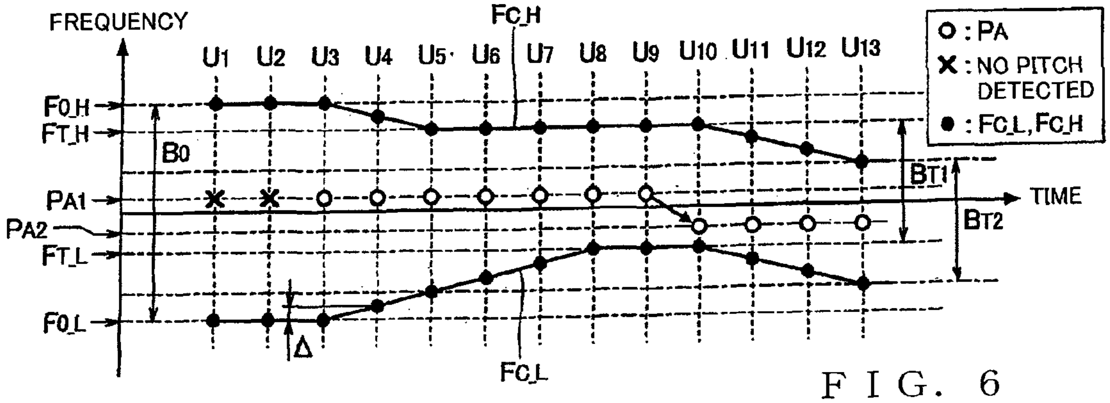
FIG. 6 is a timing chart explanatory of relationship between pass bands and pitches in the first embodiment.

FIG. 6 illustrates change over time of the pass band B in a case where the pitch PA changes in the unit segment U10 after it reaches the target band BT1. Because the bandwidth of the target band BT1 is set at the fixed value (OFST_L+OFST_H) that does not depend on the pitch PA, only the position, on the frequency axis, the pass band B in each of the unit segments U following the segment U10 approaches over time the target band BT2 (target band BT corresponding to the changed pitch PA2) with its bandwidth maintained at the value (OFST_L+OFST_H).

As set forth above, each time the pitch PA of the sound signal A0 changes, the pass band B (low-side target value FT_L and high-side target value FT_H) is caused to approach over time the target band BT corresponding to the changed pitch PA. Then, once a state where no pitch PA is detected (i.e., non-pitch-detectable state) occurs (NO determination at step S1), the pass band B is initialized to the initial band B0.

In the above-described embodiment, the pass band B of the band-pass filter 24 is variably set in accordance with a pitch PA of a sound signal A0. Namely, the varied pass band B is used for pitch detection after frequency components (e.g., noise components), diverged from the pitch PA, of the sound signal A0 is suppressed. Thus, the instant embodiment can detect a pitch PA of a sound signal A0 with a high accuracy as compared to the construction where the pass band B is fixed or the band-pass filter 24 is omitted. In the case of a tone of a musical instrument, such as a guitar or piano, whose tone generation source is a string, there is a noticeable tendency that its intensity attenuates immediate after the tone generation so that noise is emphasized relatively. Thus, the first embodiment can effectively achieve the advantageous benefit that it can detect a pitch PA with a high accuracy while reducing influences of noise, particularly in a case where a pitch PA of a tone generated from a tone generation source in the form of a string is to be detected.

Further, because the instant embodiment changes the pass band B of the band-pass filter 24 progressively over time toward the target band BT, a pitch PA of a sound signal A0 can be detected in a stable manner as compared to the construction where the pass band B is changed instantaneously to the target band BT.

B. Second Embodiment

Figure 7:
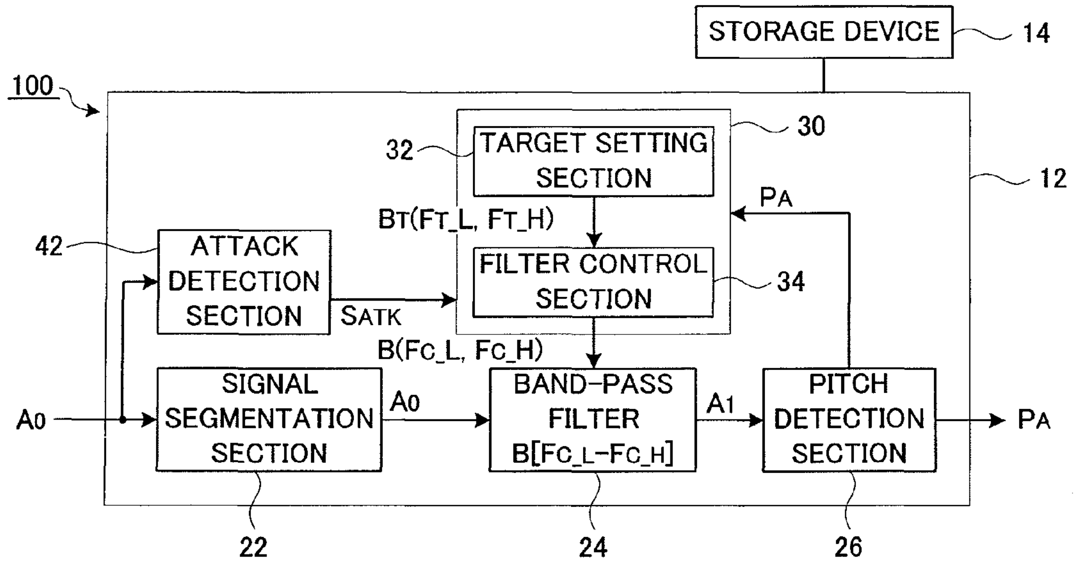
FIG. 7 is a block diagram showing a pitch detection apparatus according to a second embodiment of the present invention.

The following describe a second embodiment of the present invention, with reference to FIG. 7. Whereas the above-described first embodiment is constructed to initialize the pass band B of the band-pass filter 24 to the initial band B0 when no pitch PA has been detected (i.e., non-pitch-detectable state has occurred), the second embodiment of the pitch detection apparatus 100 is constructed to initialize the pass band B of the band-pass filter 24 to the initial band B0 when an attack (rise in intensity) of a sound signal A0 has been detected. In FIG. 7, elements similar in operation or function to those in the first embodiment are indicated by the same reference numerals and characters as used for the first embodiment and will not be described here to avoid unnecessary duplication.

As shown in FIG. 7, the second embodiment of the pitch detection apparatus 100 is generally similar in construction to the first embodiment, but different in that it includes an attack detection section 42 that is not included in the first embodiment. The attack detection section 42 detects an attack (rise in intensity) of a sound signal A0. Upon detection of the attack, the attack detection section 42 supplies a signal SATK to the control section 30. Any suitable conventionally-known technique may be employed for detection of an attack of a sound signal A0. For example, there may be employed a technique which detects, as an attack, a time point when a signal value (intensity) of a sound signal A0 has risen beyond a predetermined amount or range.

Once the signal SATK is supplied from the attack detection section 42, i.e. once an attach of the sound signal A0 is detected, the control section 30 initialize the pass band B of the band-pass filter 24 to the initial band B0. In the second embodiment, the same operations as those at and after step S3 of FIG. 3 are performed, but the operations at steps S1 and S2 of FIG. 3 are omitted in the second embodiment.

In the above-described first embodiment, where the pass band B is initialized in response to non-detection of any pitch PA, the pass band B of the band-pass filter 24 may sometimes be initialized at a time point delayed from an attack of a sound signal A0. If the initialization of the pass band B is delayed like this, a pitch PA may sometimes not be accurately detected in a case where components of pitches PA in unit segments from the attack of the sound signal A0 to the initialization (i.e., expansion) of the pass band B are located outside the narrower pass band B before being initialized (and thus these components are suppressed by the band-pass filter 24). However, in the second embodiment, where the pass band B is initialized in response to detection of an attack of a sound signal A0, it is possible to promptly initialize the pass band B without waiting for the result of the detection (i.e., presence or absence of a detected pitch PA) by the pitch detection section 26. Thus, the second embodiment can detect a pitch PA of a sound signal A0 (particularly, a pitch PA near the attack of the sound signal A0) with a high accuracy as compared to the first embodiment of the present invention.

C. Third Embodiment

Figure 8:
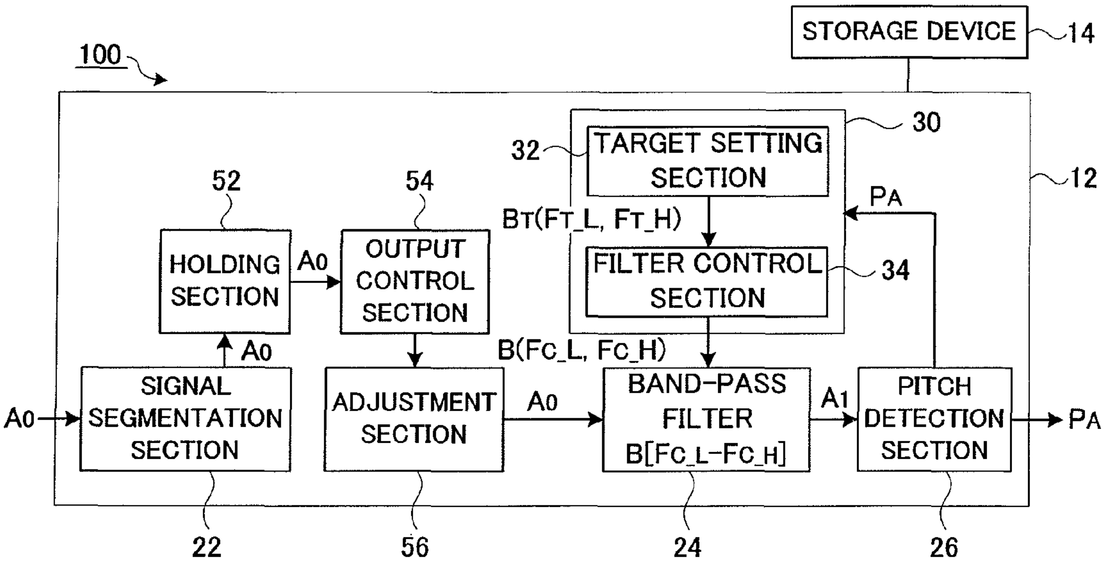
FIG. 8 is a block diagram showing a pitch detection apparatus according to a third embodiment of the present invention.

FIG. 8 is a block diagram showing a pitch detection apparatus 100 according to a third embodiment of the present invention. In FIG. 8, elements similar in operation or function to those in the first embodiment are indicated by the same reference numerals and characters as used for the first embodiment and will not be described here to avoid unnecessary duplication. As shown, the third embodiment of the pitch detection apparatus 100 is generally similar in construction to the first embodiment, but different in that it includes a holding section 52, an output control section 54 and an adjustment section 56 that are not included in the first embodiment.

The holding section 52 is a FIFO (First-In-First-Out) type delay buffer (register or memory) that sequentially holds a plurality of (i.e., N) of unit segments U of a sound signal A0, output from the signal segmentation section 22, in the same order as the unit segments U are supplied from the signal segmentation section 22. Although the holding section 52 is shown as a separate component from the storage device 14 in the figure, a storage area of the storage device 14 may be used as the holding section 52.

The output control section 54 selectively acquires any one of the N unit segments U. The unit segment U which the output control section 54 acquires from the holding section 52

(i.e., readout position of the holding section 52) is variably controlled. Thus, the holding section 52 and the output control section 54 function as a delay circuit for imparting a variable delay amount D to the individual unit segments U. Namely, the operation of the output control section 54 acquiring the latest (first-stage) unit segment U from among the N unit segments U corresponds to operation of a delay circuit whose delay amount D is set at a minimum value (zero), while the operation of the output control section 54 acquiring the oldest (N-th-stage) unit segment U from among the N unit segments U corresponds to operation of the delay circuit whose delay amount D is set at a maximum value N.

The adjustment section 56 adjusts the sound signal intensity of the unit segment U acquired by and the output from the output control section 54. For example, the adjustment section 56 may be in the form of a multiplier for multiplying the signal value of the sound signal A0 by a variable adjustment value M. The sound signal A0 adjusted by the adjustment section 56 is supplied to the band-pass filter 24. Control of the adjustment value M will be described later.

Figure 9:
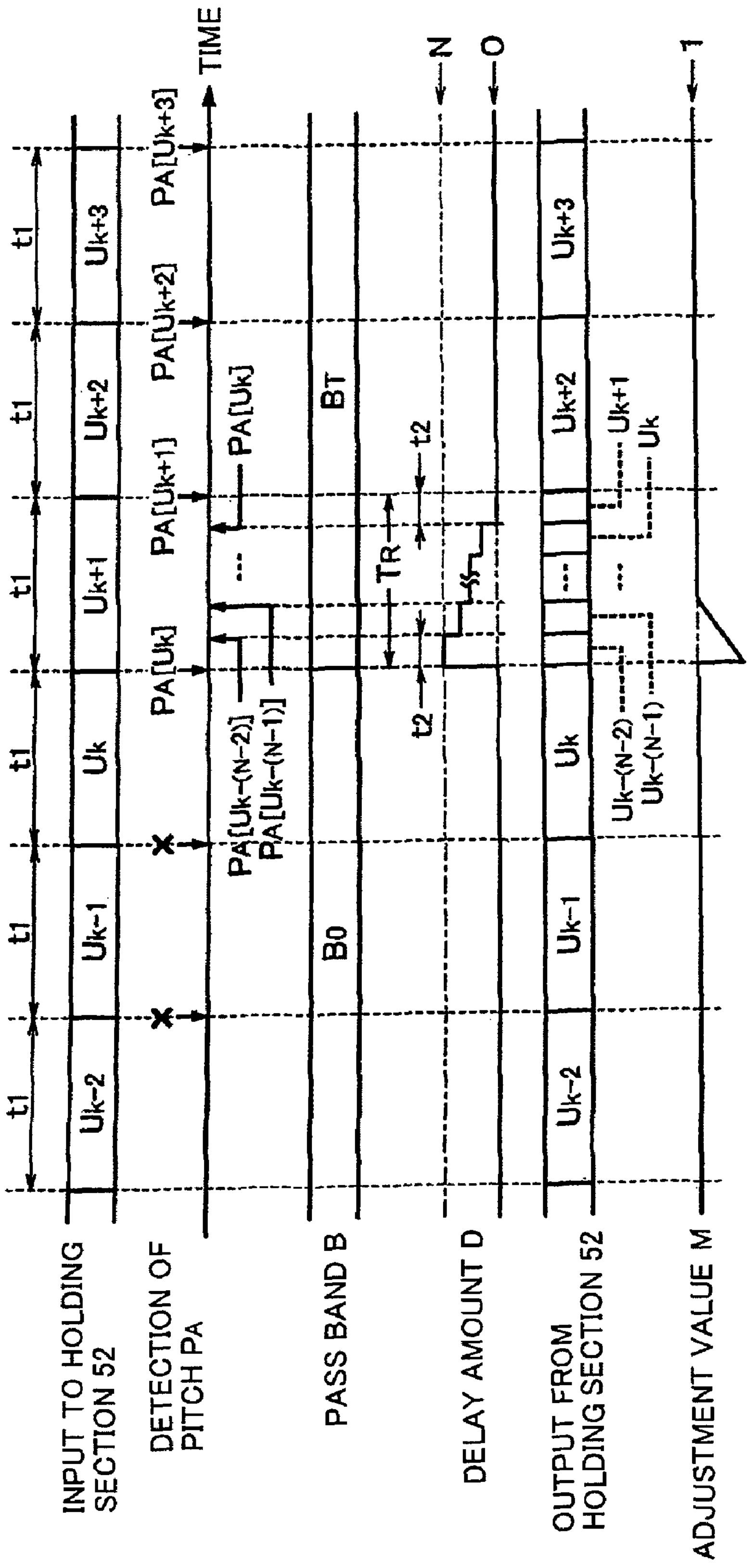
FIG. 9 is a timing chart explanatory of behavior of the third embodiment.

FIG. 9 is a timing chart showing operation of the third embodiment. As shown in FIG. 9, individual unit segments U of a sound signal A0 are sequentially supplied to the holding section 52 with a cyclic period t1. Until the pitch detection section 26 detects a pitch PA of any one of the unit segments U, the delay amount D of the output control section 54 is kept set at a minimum value (zero), and the adjustment value M of the adjustment section 56 is kept set at a reference value of "1". Thus, the individual unit segments output from the signal segmentation section 22 are sequentially supplied to the band-pass filter 24, with no delay, with the cyclic period t1 by way of the holding section 52 and adjustment section 56. Until the pitch detection section 26 detects a pitch PA of any one of the unit segments U, the pass band B of the band-pass filter 24 is kept set at the initial band B0. As indicated by "Detection of Pitch PA", the illustrated example of FIG. 9 assumes a case where no pitch PA is detected in and before the unit segment Uk−1 (as indicated by mark "X") and a pitch PA is detected in each of the following unit segments U (i.e., in and after the unit segment Uk (given time frame)).

Once the pitch detection section 26 detects a pitch PA[Uk] of the unit segment Uk, the target setting section 32 of the control section 30 calculates a target band BT (i.e, low-side target value FT_L and high-side target value FT_H) by performing the arithmetic operations of Mathematical Expressions (2a) and (2b) above on the detected pitch PA[Uk]. Further, the filter control section 34 sets the target band BT, set by the target setting section 32 in accordance with the detected pitch PA[Uk], into the band-pass filter 24 as the band B. Namely, whereas the above-described first and second embodiments are constructed to cause the pass band B to approach the target band BT progressively over time, the third embodiment is constructed to set the pass band B at the target band BT (i.e., set the target band BT as the pass band B) immediately after the detection of the pitch PA[Uk].

Once the pass band B is set at the target band BT, the output control section 54 sets the delay amount D at the maximum value N (i.e, delay amount D corresponding to the N-th-stage unit segment U). Then, in a time period TR following the setting of the target band BT and having a time length equal to or smaller than the cyclic period t1 (this time period will hereinafter be referred to as "re-processing time period TR"), the output control section 54, while sequentially reducing the delay amount D to the minimum value (zero) with a cyclic period t2 (e.g., t2=t1/N) shorter than the cyclic period t1, sequentially acquires, from the holding section 52, unit segments U corresponding to delay amounts D and outputs the acquired unit segments U to the adjustment section 56. Thus, as shown in FIG. 9 ("Output from Holding Section 52"), the N unit segments U (Uk−(N−2)−Uk+1) held by the holding section 52 at the end point of the re-processing time period TR are sequentially output to the adjustment section 56, in predetermined order from the oldest unit segment U (i.e., unit segment Uk−(N−2) stored at the N-th stage) to the newest unit segment U (i.e, unit segment UK+1 stored at the first stage) with the cyclic period t2 in the re-processing time period TR. Namely, in this case, the N unit segments U are sequentially output from the holding section 52 at a higher speed (N-fold or N-times higher speed) than in the case where no pitch PA has been detected (i.e., in a time period other than the re-processing time period TR). At the time point when the pass band B has been set at the target pass BT, the adjustment value M of the adjustment section 56 is set at a positive number smaller than the reference value "1" and then increases over time to reach the reference value; namely, the sound signal to be supplied to the band-pass filter 24 is temporarily lowered in level and then progressively returned to the original level.

The band-pass filter 24, whose pass band B has been controlled to take the target pass BT, sequentially processes the N units output from the holding section 52 at the N-fold (N-times higher) speed, and then the pitch detection section 26, as shown in FIG. 9 ("Detection of Pitch PA"), sequentially detects and outputs the respective pitches (PA[Uk−(N−1)−PA [Uk+1]] of the N unit segments U having been processed by the band-pass filter 24. Namely, for the individual unit segments U having been held by the holding section 52 at the time point when the pitch PA[Uk] of the unit segment Uk is detected, not only the filtering by the band-pass filter 24, whose pass band B is set at the initial band B0, and the pitch detection by the pitch detection section 26 is performed with the cyclic period t1, but also the filtering by the band-pass filter 24, whose pass band B is set at the target band BT, and the pitch detection by the pitch detection section 26 is performed with the cyclic period t2 (at the N-fold speed) in the re-processing time period TR. Because the pass band B is set at the target band BT corresponding to the pitch PA of the sound signal A0, the pitches PA detected for the individual unit segments U within the re-processing time period TR are more accurate than the pitches PA detected with the initial band B0 before the start of the re-processing time period TR. Note that, in the pitch detection, the band-pass filter 24 operates at a high speed in accordance with a predetermined clock rate rather than operating in real time in accordance with a sampling rate of an audio sound signal in question. Thus, it is possible to collectively process, with no particular problem, sound signals (delayed sound signals) of a plurality of previous time frames within the re-processing time period TR corresponding to the cyclic period t1 of a real-time sampling rate.

The delay amount D decreases to zero at the end point of the re-processing time period TR. After elapse of the re-processing time period TR, the filtering (with the target band BT) by the band-pass filter 24 and the pitch detection by the pitch detection section 26 is performed sequentially on unit segments U (following the unit segment Uk+1) supplied sequentially from the signal segmentation section 22 with the cyclic period t1, in the same way as before the start of the re-processing time period TR. Operation performed in response to change in the pitch PA after the elapse of the re-processing time period TR is similar to that described above with reference to FIG. 6. Further, when no pitch PA has been detected (i.e., when the non-pitch-detectable state occurred) after the elapse of the re-processing time period TR, the control section 30 (filter control section 34) initializes the pass band B of the band-pass filter 24 to the initial band B0.

The above-described third embodiment of the present invention, where the pass band B of the band-pass filter 24 is variably set in accordance with a pitch PA of a sound signal A0, can detect a pitch PA of a sound signal A0 with a high accuracy in the same manner as the first embodiment. Further, because the third embodiment is constructed to perform the filtering, using the target band BT corresponding to the pitch PA, and pitch detection (re-detection of a pitch) on previous unit segments having been subjected to the filtering and pitch detection using the initial band B0, the third embodiment can advantageously detect pitches PA of the individual unit segments U in a stable manner, despite the construction that the pass band B of the band-pass filter 24 is changed instantaneously to the target band BT corresponding to the detected pitch PA. Further, because individual unit segments are output from the holding section 52 at the N-fold speed within the re-processing time period TR, pitches PA can be detected, with no delay, for unit segments U to be newly supplied to the holding section 52 after the lapse of the re-processing time period TR.

Further, because the instant embodiment lowers a signal value of the sound signal A0 in accordance with an adjustment value M at the beginning of the re-processing time period TR, it can advantageously suppress discontinuity of the waveform of the sound signal A0 at the start point of the re-processing time period TR. However, if discontinuity of the waveform of the sound signal A0 does not present any particular problem, then the adjustment section 56 of FIG. 9 may be dispensed with.

Note that, whereas FIG. 9 shows the third embodiment as constructed on the basis of the first embodiment, the construction of the second embodiment for initializing the pass band B to the initial band B0 in response to detection of an attack of an audio or sound signal A0 may also be added to the third embodiment of FIG. 9.

D. Modifications

The above-described embodiments may be modified variously. Specific examples of such modifications are as follows. Two or more selected ones of the following examples may be combined as necessary.

(1) Modification 1:

Whereas each of the above-described embodiments has been described above as setting the bandwidth of the target band BT at the fixed value (OFST_L+OFST_H), the bandwidth of the target band BT may be variably controlled, for example, in accordance with a detected pitch PA. For example, the target band BT may be set at a wider bandwidth as the detected pitch PA becomes higher.

(2) Modification 2:

Whereas each of the above-described embodiments is constructed to initialize the pass band B of the band-pass filter 24 in response to non-detection of any pitch PA, i.e. non-pitch-detectable state (first embodiment) or in response to detection of an attack of a sound signal A0 (second embodiment), the present invention is not so limited; for example, the pass band B of the band-pass filter 24 may be initialized to the initial band B0 in response to detection of a release (fall) of a sound signal A0.

(3) Modification 3:

Whereas each of the first and second embodiments has been described above as causing the low-side cutoff frequency FC_L and high-side cutoff frequency FC_H to approach the low-side target value FT_L and high-side target value FT_H, respectively, by varying the low-side cutoff frequency FC_L and high-side cutoff frequency FC_H by the predetermined value Δ at a time, the way for causing the pass band B of the band-pass filter 24 to approach the target band BT is not so limited; for example, there may be employed a construction where a low-side cutoff frequency FC_L and high-side cutoff frequency FC_H at each intermediate time point in a predetermined time period are controlled (or interpolated) in such a manner that the pass band B of the band-pass filter 24 can approach the target band BT within the predetermined time period. Therefore, in this case, a minimum unit change amount of the low-side cutoff frequency FC_L and high-side cutoff frequency FC_H need not be of a fixed value Δ.

The present application is based on, and claims priority to, Japanese Patent Application No. 2008-289974 filed on Nov. 12, 2008. The disclosure of the priority application, in its entirety, including the drawings, claims, and the specification thereof, is incorporated herein by reference.

What is claimed is:

1. A pitch detection apparatus comprising:

a band-pass filter which suppresses frequency components of a sound signal that are lower than a low-side cutoff frequency and that are higher than a high-side cutoff frequency;

a pitch detection section which detects a pitch of the sound signal having been processed by said band-pass filter;

a target setting section which, in accordance with the pitch detected by said pitch detection, variably sets a low-side target value lower than the detected pitch and a high-side target value higher than the detected pitch; and a filter control section which not only causes the low-side cutoff frequency to approach the low-side target value over time but also causes the high-side cutoff frequency to approach the high-side target value over time.

2. The pitch detection apparatus as claimed in claim 1 wherein said filter control section initializes the low-side cutoff frequency and the high-side cutoff frequency to respective predetermined initial values.

3. The pitch detection apparatus as claimed in claim 2 wherein said filter control section initializes the low-side cutoff frequency and the high-side cutoff frequency to the respective predetermined initial values when no pitch has been detected by said pitch detection section.

4. The pitch detection apparatus as claimed in claim 2 which further comprises an attack detection section which detects an attack of the sound signal, and wherein, when said attack detection section has detected an attack of the sound signal, said filter control section initializes the low-side cutoff frequency and the high-side cutoff frequency to the respective predetermined initial values.

5. The pitch detection apparatus as claimed in claim 2 wherein an initial band determined by the low-side cutoff frequency and the high-side cutoff frequency initialized by said filter control section is a frequency band including a relatively wide range of possible pitches which the sound signal may have.

6. The pitch detection apparatus as claimed in claim 5 wherein said filter control section determines the respective predetermined initial values of the low-side cutoff frequency and the high-side cutoff frequency such that the initial band has a bandwidth corresponding to a characteristic of a sound generation source of the sound signal.

7. The pitch detection apparatus as claimed in claim 1 wherein said target setting section sets, as the low-side target value, a value lower by a first offset value than the pitch detected by said pitch detection section and sets, as the high-side target value, a value higher by a second offset value than the pitch detected by said pitch detection section.

8. The pitch detection apparatus as claimed in claim 7 wherein said second offset value comprises a greater cent value than said first offset value.

9. The pitch detection apparatus as claimed in claim 7 wherein the first and second offset values are determined in accordance with a characteristic of a sound generation source of the sound signal.

10. The pitch detection apparatus as claimed in claim 1 wherein said pitch detection section sequentially detects a pitch of the sound signal for each of predetermined time frames.

11. A computer-implemented pitch detection method comprising:

a step of filtering a sound signal for suppressing frequency components of the sound signal that are lower than a low-side cutoff frequency and that are higher than a high-side cutoff frequency;

a step of detecting a pitch of the sound signal having been processed by said step of filtering;

a step of variably setting a low-side target value lower than the pitch detected by said step of detecting and a high-side target value higher than the detected pitch; and a step of causing the low-side cutoff frequency to approach the low-side target value over time and causing the high-side cutoff frequency to approach the high-side target value over time.

12. A non-transitory computer-readable storage medium storing a program for causing a computer to perform a pitch detection method, said pitch detection method comprising: a step of filtering a sound signal for suppressing frequency components of the sound signal that are lower than a low-side cutoff frequency and that are higher than a high-side cutoff frequency; a step of detecting a pitch of the sound signal having been processed by said step of filtering; a step of variably setting a low-side target value lower than the pitch detected by said step of detecting and a high-side target value higher than the detected pitch; and a step of causing the low-side cutoff frequency to approach the low-side target value over time and causing the high-side cutoff frequency to approach the high-side target value over time.

13. A pitch detection apparatus comprising:

a holding section which time-serially holds a sound signal;

a band-pass filter which suppresses frequency components of the sound signal that are outside a pass band;

a pitch detection section which detects a pitch of the sound signal, having been processed by said band-pass filter, for each of predetermined time frames;

a control section which variably sets the pass band of said band-pass filter in accordance with the pitch detected by said pitch detection section; and an output control section which normally supplies sound signals of individual ones of the time frame to said band-pass filter with a first cyclic period, wherein, once a state of pitch detection by said pitch detection section changes, in a given one of the time frames, from a state where no pitch could be detected to another state where a pitch could be detected, said output control section supplies, in time-serial order, sound signals of the given time frame and a plurality of previous time frames, preceding the given time frame, from said holding section to said band-pass filter with a second cyclic period shorter than said first cyclic period, so that a pitch detection operation on the sound signals of the plurality of previous time frames is performed again by said pitch detection section.

14. The pitch detection apparatus as claimed in claim 13 which further comprises an adjustment section which performs an adjustment operation for temporarily lowering levels of the sound signals of the plurality of previous time frames, supplied to said band-pass filter with a second cyclic period, and then progressively returning the sound signals of the plurality of previous time frames to original levels.

15. A computer-implemented pitch detection method comprising:

a step of time-serially holding a sound signal in a register;

a step of filtering the sound signal by means of a band-pass filter which suppresses frequency components of the sound signal that are outside a pass band;

a detection step of detecting a pitch of the sound signal, having been processed by said step of filtering, for each of predetermined time frames;

a step of variably setting the pass band of the band-pass filter in accordance with the pitch detected by said detection step; and a supply step of normally supplying sound signals of individual ones of the time frame to the band-pass filter with a first cyclic period, wherein, once a state of pitch detection by said detection step changes, in a given one of the time frames, from a state where no pitch could be detected to another state where a pitch could be detected, said supply step supplies, in time-serial order, sound signals of the given time frame and a plurality of previous time frames, preceding the given time frame, from the resister to the band-pass filter with a second cyclic period shorter than said first cyclic period, so that a pitch detection operation is performed again on the sound signals of the plurality of previous time frames by said detection step.

16. A non-transitory computer-readable storage medium storing a program for causing a computer to perform a pitch detection method, said pitch detection method comprising: a step of time-serially holding a sound signal in a register; a step of filtering the sound signal by means of a band-pass filter which suppresses frequency components of the sound signal that are outside a pass band; a detection step of detecting a pitch of the sound signal, having been processed by said step of filtering, for each of predetermined time frames; a step of variably setting the pass band of the band-pass filter in accordance with the pitch detected by said detection step; and a supply step of normally supplying sound signals of individual ones of the time frame to the band-pass filter with a first cyclic period, wherein, once a state of pitch detection by said detection step changes, in a given one of the time frames, from a state where no pitch could be detected to another state where a pitch could be detected, said supply step supplies, in time-serial order, sound signals of the given time frame and a plurality of previous time frames, preceding the given time frame, from the resister to the band-pass filter with a second cyclic period shorter than said first cyclic period, so that a pitch detection operation on the sound signals of the plurality of previous time frames is performed again on the sound signals of the plurality of previous time frames by said detection step.

* * * * *